United States Patent
Opitz

(10) Patent No.: US 6,519,342 B1
(45) Date of Patent: *Feb. 11, 2003

(54) METHOD AND APPARATUS FOR FILTERING AN AUDIO SIGNAL

(75) Inventor: Martin Opitz, Vienna (AT)

(73) Assignee: AKG Akustische u. Kino-Gerate Gesellschaft m.b.H., Vienna (AT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/762,497

(22) Filed: Dec. 9, 1996

(30) Foreign Application Priority Data

Dec. 7, 1995 (DE) ......................... 195 45 623

(51) Int. Cl.$^7$ ................................. H03G 3/00
(52) U.S. Cl. ........................ 381/61; 375/231; 708/322
(58) Field of Search ..................... 381/61, 63; 375/350, 375/232, 231; 708/322

(56) References Cited

U.S. PATENT DOCUMENTS

| | | | |
|---|---|---|---|
| 5,123,050 A | | 6/1992 | Serikawa et al. |
| 5,168,459 A | * | 12/1992 | Hiller ................... 708/322 |
| 5,369,710 A | | 11/1994 | Asai |
| 5,452,360 A | | 9/1995 | Yamashita et al. |
| 5,717,727 A | * | 2/1998 | Yamada ................ 375/350 |

FOREIGN PATENT DOCUMENTS

DE 4204289 8/1992
DE 4328620 1/1995

OTHER PUBLICATIONS

"Aufwand Bei Digitalfiltern Gesenkt" Dipl.–Ing. Rolf Kapust & Dipl.–Ing. Hans–Günter Göring, pp. 82–84, vol. 15, 1988.

* cited by examiner

Primary Examiner—Minsun Oh Harvey
(74) Attorney, Agent, or Firm—Friedrich Kueffner

(57) ABSTRACT

A method and an apparatus for filtering an audio signal include the steps of making the audio signal available in digitalized form, wherein the duration of the sampling interval is half or less than half of the period duration of the highest frequency to be expected in the audio signal, a digitalized impulse response is made available in accordance with the desired filtering effect, and a convolution sum is formed from the samples of the impulse response and the samples of the audio signal, wherein, (i) several adjacent samples of the impulse response define a corresponding interval within at least a time portion of the impulse response which is shorter than the impulse response, (ii) within the interval defined in this manner, the samples of the impulse response corresponding to the interval defined in this manner are equated to a value which is a function of one or more of the samples of the digitalized impulse response falling within the interval defined in this manner, and (iii) the steps (i) and (ii) are repeated as necessary, with the requirement that the intervals defined in this manner do not overlap, so that for computing the convolution sum a time-coarsened impulse response is utilized for the convolution at least in one time portion, and the impulse response is otherwise used unchanged for the convolution.

17 Claims, 7 Drawing Sheets

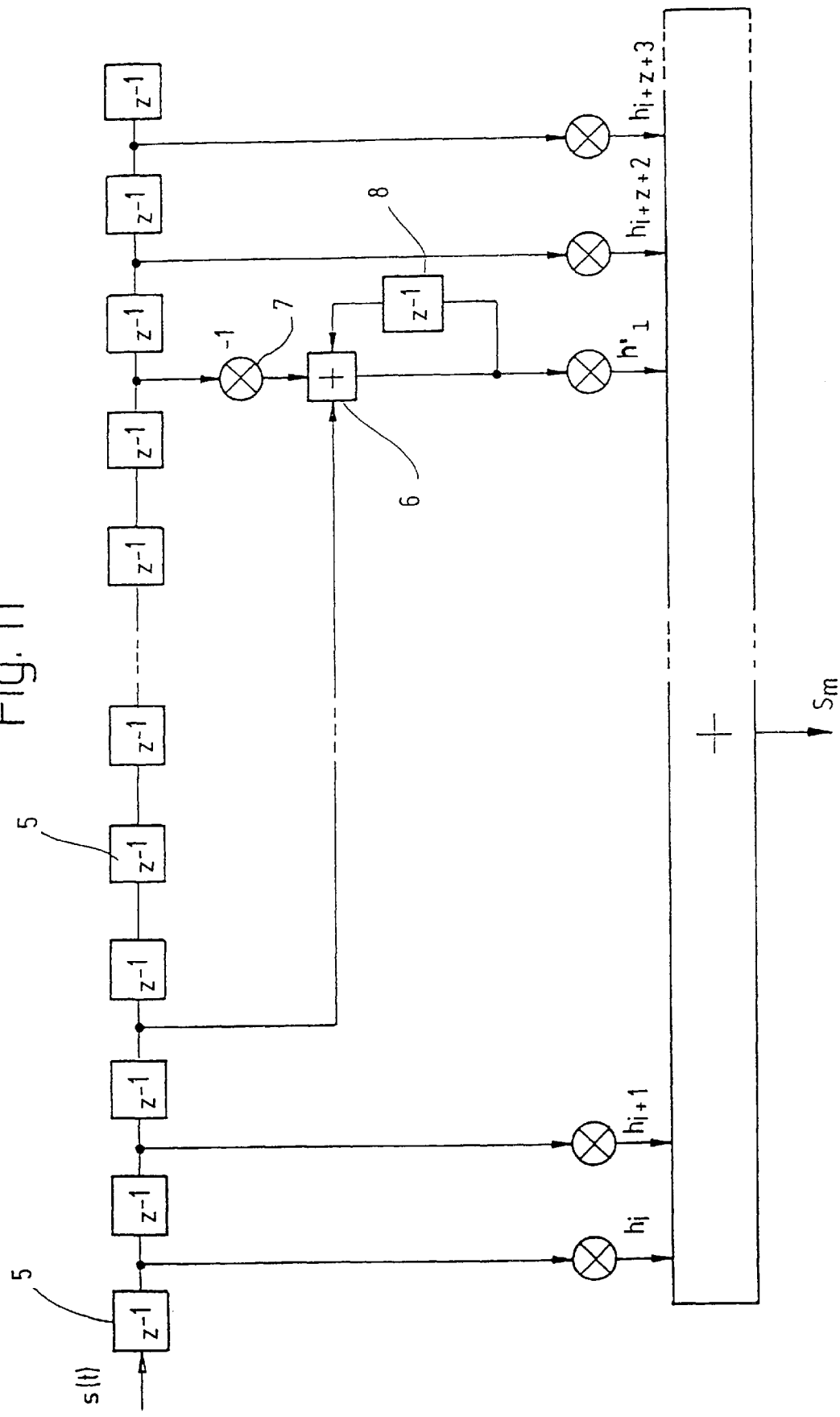

METHOD AND APPARATUS FOR FILTERING AN AUDIO SIGNAL

BACKGROUND OF THE INVENTION

1. Field of the Invention

The present invention relates to a method and an apparatus for filtering an audio signal.

2. Description of the Related Art

It is frequently necessary to filter audio signals. For example, a certain room character is to be conveyed in the reproduction. Sound recordings frequently take place in the immediate vicinity of the sound source. This means that the portion of the room is not taken into consideration during the recording. If the signal recorded in this manner is not further processed, the listener will not have the same listening impression as a person who was present in the room in which the original event took place.

However, if it is known, for example, from measurements, what influence the room has on the listening event, the recorded audio signal can be converted by subsequent filtering back into the original acoustic signal.

In this connection, it is of no significance in principle as to whether the reproduction takes place through loudspeaker or head set.

In the case of the reproduction through headsets, the known "in-head localization" can be avoided if the binaural effect is taken into consideration during filtering. This is understood to be filtering of the audio signal with the individual head related transfer function of the listener.

The more exact the filters can be taken into consideration during the reproduction, the more true to nature will be the auditory impression.

However, acoustic filters can also be used for achieving a certain tone color or for raising or lowering individual frequency ranges. The so-called dividing networks, which assign an audio signal to the various loudspeakers of a box, also constitute audio filters.

Within the time range, each filtering can be represented by a convolution with the appropriate impulse response. If the audio signals are present in digital form, each convolution constitutes a time-consuming operation which is composed of a large number of multiplications and additions. Accordingly, there have been many attempts to reduce the required computations for this convolution.

The simplest method is to carry out a so-called windowing. In that case, only a portion of the impulse response is utilized for the convolution, not the entire impulse response. Consequently, important information may be lost. In practice, windowing is carried out in such a way that only the beginning of the impulse response is taken into consideration, and the end, in which the important components for the fine structure (e.g. reverberation) at low and middle frequencies are contained, is cut off. This is particularly true for minimum phase filters or approximate minimum phase filters.

An algorithm which limits the impulse response to those components which are relevant for listening has been proposed in German Patent 43 28 620. While this does not constitute an exact solution of the problem, the utilization of the various masking effects makes it possible that the listener does not perceive a difference between the reproduced audio signal and the original audio signal. Only those components of the impulse response are utilized which are above a certain threshold. This means that the required computations can be reduced significantly.

As explained in the aforementioned German patent, $5 \times 10^9$ additions and multiplications per second are required for an exact computation of the convolution in the case of an impulse response of two seconds, a sampling rate of 50 kHz and a bandwidth of the audio signal of 20 kHz.

Under these circumstances, it is understandable that methods have been sought for reducing the required computations for the convolution.

Another known measure for reducing the required computations in digital filtering has been described in the paper "Aufwand bei Digitalfiltern gesenkt" [Reduction of requirements in digital filters], published in "Elektronik", Volume 15, 1988, pages 82ff. In this method, the audio signal is additionally filtered in order to cut the bandwidth of the audio signal in half. Subsequently, the audio signal is sampled with half the sampling frequency. As a result of this measure, all high frequency components disappear, i.e., the useful signal obtained after the convolution has a significantly smaller a bandwidth than the original audio signal. In other words, the reduction of the required computations is achieved in exchange for an impairment of the sound impression.

SUMMARY OF THE INVENTION

Therefore, it is the primary object of the present invention to provide a method and an apparatus of the above-described type which facilitate a significant reduction of the number of computing operations without negatively influencing the high-frequency signal portions of the audio signal and of the impulse response.

In accordance with the present invention, the method for filtering an audio signal includes the steps of making the audio signal available in digitalized form, wherein the duration of the sampling interval is half or less than half of the period duration of the highest frequency to be expected in the audio signal, a digitalized impulse response is made available in accordance with the desired filtering effect, and a convolution sum is formed from the samples of the impulse response and the samples of the audio signal, wherein, (i) several adjacent samples of the impulse response define pa corresponding interval within at least one time portion of the impulse response which is shorter than the impulse response, (ii) within the interval defined in this manner, the samples of the impulse response corresponding to the interval defined in this manner are equated to one value which is one function of one or more of the samples of the digitalized impulse response falling within the interval defined in this manner, and (iii) the steps (i) and (ii) are repeated as necessary, with the requirement that the intervals defined in this manner do not overlap, so that for computing the convolution sum an impulse response is utilized which is time-coarsned at least in one time portion, and the impulse response is otherwise used unchanged for the convolution.

The apparatus for carrying out this method includes a computing unit with an input to which the samples of the digitalized audio signal are supplied and a storage unit in which are stored the values which correspond to samples of a predetermined impulse response.

When computing the output signal of the filter, a real or virtual impulse response is used which, compared to the actual or true impulse response, is approximated by steps with the greater time duration. Within each step, all samples of the impulse response contained in the step are kept constant, independently of the actual pattern of the true impulse response. Consequently, the required computations can be significantly reduced. With respect to the computation of one sample of the output signal of the filter, this means that it is sufficient that, within an interval of the audio signal which is covered by a step of the impulse response defined as described above, only the sampling values of the audio signal must be summed up and subsequently the sum formed in this manner must only be multiplied with the sample of the step of the impulse response. It is apparent that one multiplication and one addition are sufficient for a step of the approximated impulse response. In the prior art, on the other hand, for the corresponding time portion of the impulse response, it is necessary to carry out as many additions and multiplications as sampling values are contained therein.

On the other hand, in the novel method according to the present invention, the acoustically significant influences of the middle and low frequencies and/or of the decaying portion of the impulse response of the respectively selected filter are maintained.

A further simplification is achieved in that, for the next sample of the output signal, instead of a complete new sum formation, only the omitted samples is subtracted from the previously obtained sum over the samples of the audio signal and that a newly added samples is summed up instead.

The steps of the impulse response utilized for the computation, called approximated impulse response in the following, must have a duration which is at least half of the period duration of the highest frequency to be considered. Assuming that middle frequencies of the auditory range are still to be taken into consideration, for example, in order to avoid "in-head localization" and other acoustic effects, it is sufficient to utilize an approximated impulse response whose steps have a duration of greater than or equal to $1/3000$ sec. On the other hand, the audio signal has a frequency range which reaches 15 kHz so that the time portions of the approximated impulse response are 10 times wider than the time portions of the audio signal. When taking this relationship and the above explanations into consideration, the number of necessary multiplications and additions per second are reduced by the factor 5 as compared to the state of the art.

If the duration of the steps of the approximated impulse response can be selected even longer, even greater reductions of the numbers of necessary multiplications and additions are achieved.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention.

BRIEF DESCRIPTION OF THE DRAWING

In the drawing:

FIG. 11 is an illustration showing a portion of the architecture of a convolution processor, wherein the impulse response is approximated by longer time periods.

DETAILED DESCRIPTION OF THE PREFERRED EMBODIMENTS

Figure 1:
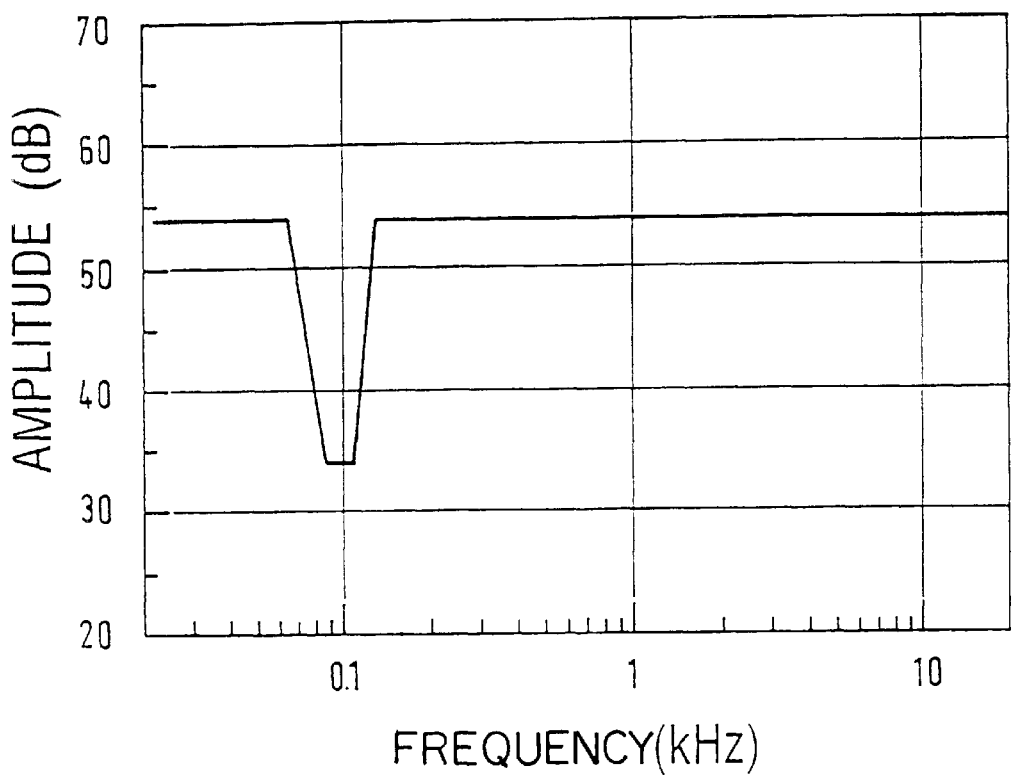
FIG. 1 is a diagram showing the amplitude pattern of a band-stop filter with attenuation in the range of about 100 Hz.

FIG. 1 shows the amplitude pattern of a filter having the band-stop characteristic in the range of around 100 Hz. The frequency is plotted logarithmically and it can be seen that the elimination width is about 30 Hz. Toward the low frequencies, the filter has an amplitude drop which is less steep than on the high-frequency side. Damping is about 20 dB. The amplitude pattern is otherwise smooth.

Figure 2:
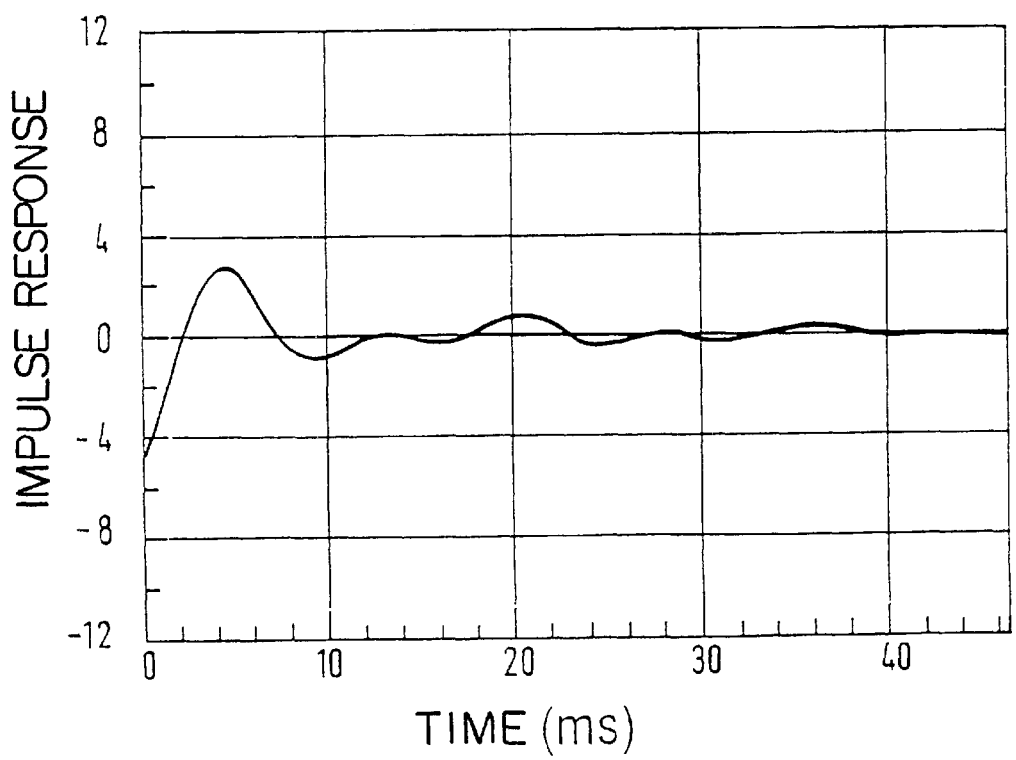
FIG. 2 is a diagram showing the decaying portion of the impulse response of the filter of FIG. 1.

When the impulse response is computed for the filter of FIG. 1, a time pattern is achieved in the decaying portion as it is shown in FIG. 2. This portion of the impulse response has a duration of about 40 ms and about ten recognizable zero-axis crossings. With increasing time, the amplitude of the impulse response becomes so small that a significant influence on the audio signal no longer occurs.

Filtering of an audio signal by means of the filter whose amplitude pattern is shown in FIG. 1, can be effected by computation by convolving the audio signal with the impulse response of the filter. For this purpose, the audio signal is digitalized by taking into consideration the sampling theorem, i.e., it is converted into a step function. The same is done with the impulse response, wherein the sampling rate for the impulse response is selected equal to the sampling rate of the audio signal. The digitalization turns the convolution integral into a convolution sum as follows:

$$O_t = \sum_{i=0}^{N} s_{t-i} \cdot h_i$$

wherein $O_t$=the amplitude of the output signal of the filter at time t, $h_1$=the sample of the impulse response, $S_{t-i}$=the sample of the audio signal at time t−i, and N=the number of sample of the impulse response.

As can be easily seen from the above equation, the number of products which must be successively computed for each time t corresponds to the duration of the impulse response expressed in the number of its samples. The resulting products must then be summed up. Since this operation must be carried out in real time, highly efficient computers are required if the computation time is to be reduced.

Figure 3:
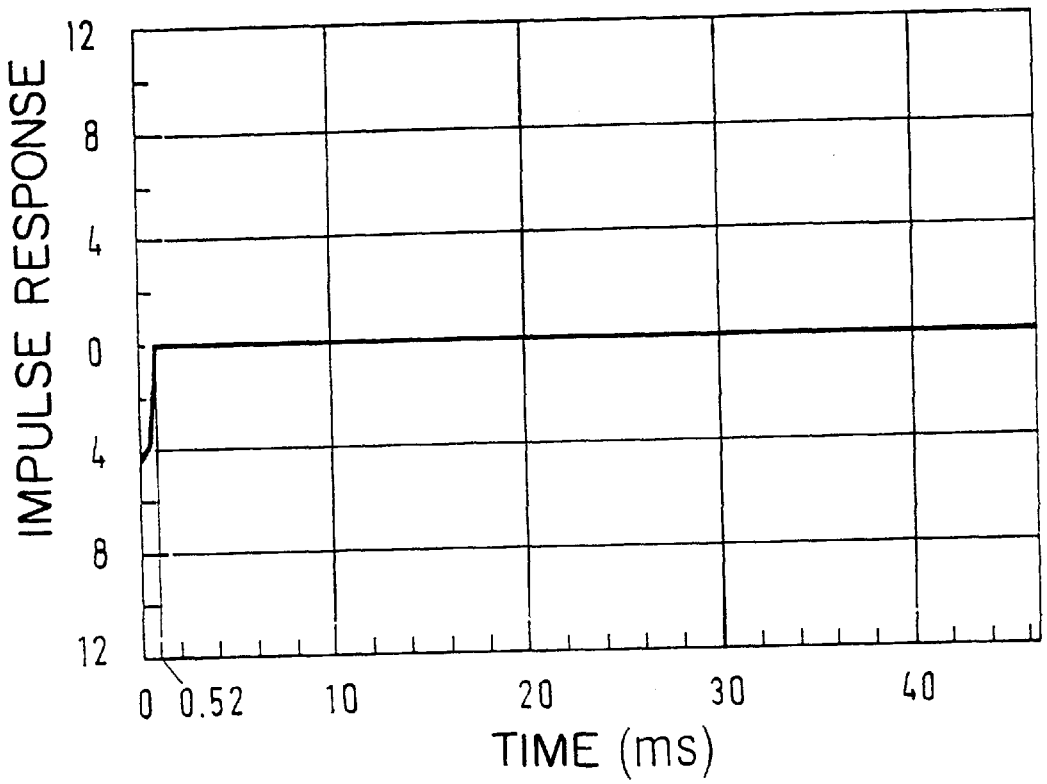
FIG. 3 is a diagram showing an impulse response modified in accordance with the prior art by windowing derived from the impulse response of FIG. 2.
Figure 4:
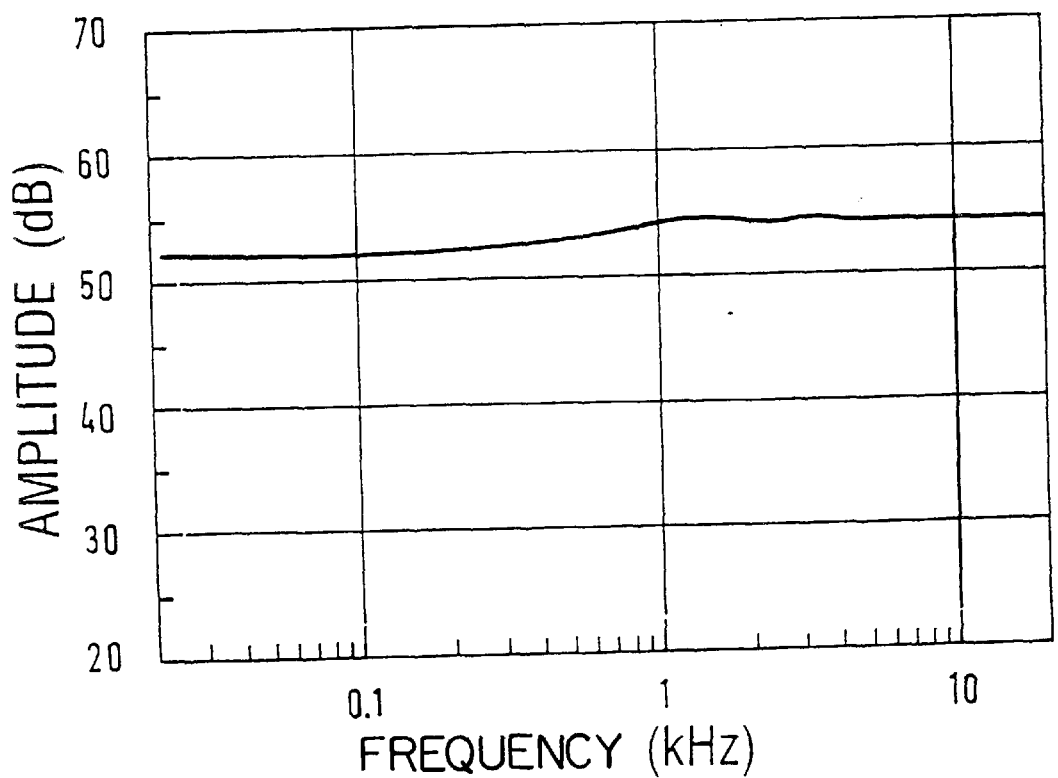
FIG. 4 is a diagram showing the amplitude pattern corresponding to the impulse response of FIG. 3.

If the windowing method is used for reducing the required computations, the impulse response of FIG. 2 is reduced to the derived impulse response of FIG. 3. Of the actual impulse response, only a portion having a duration of altogether 0.5 ms remains while the remainder becomes zero. While this reduces the required computations significantly, the amplitude pattern of a filter having an impulse response according to FIG. 3 would no longer have any similarity with the amplitude pattern of the desired filter, as can be seen in FIG. 4. FIG. 4 shows the amplitude pattern of the filter with the impulse response according to FIG. 3. The band-elimination characteristic at 100 Hz has disappeared completely and a slight lowering of the amplitude for practically all frequencies lower than 1 kHz occurs instead.

Figure 5:
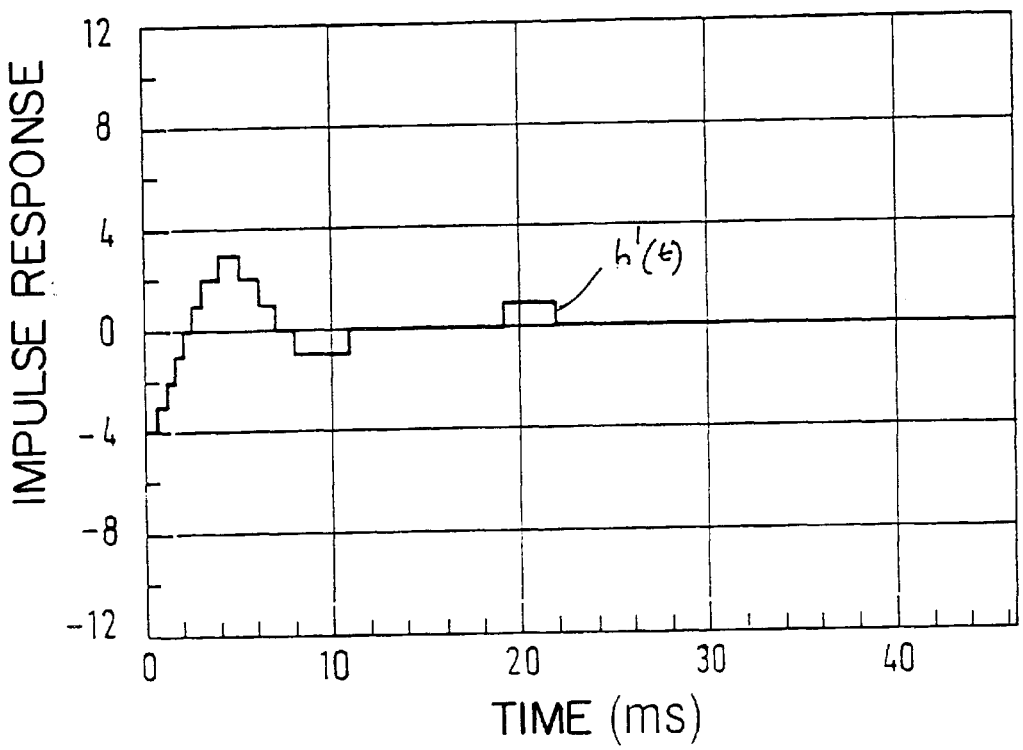
FIG. 5 is a diagram showing an impulse response which is approximated in accordance with the present invention to the impulse response of FIG. 2.

On the other hand, if the impulse response is derived in accordance with the present invention, an approximated impulse response h'(t) is produced, wherein only the decaying portion thereof is shown in FIG. 5. Depending on the method used, this approximated impulse response occurs as a result of measurements or it exists only virtually during the computation. For a better understanding, it is about further assumed that the approximated impulse response exists. For producing this impulse response h'(t), steps are used whose duration is ten times greater than the sampling interval.

Figure 6:
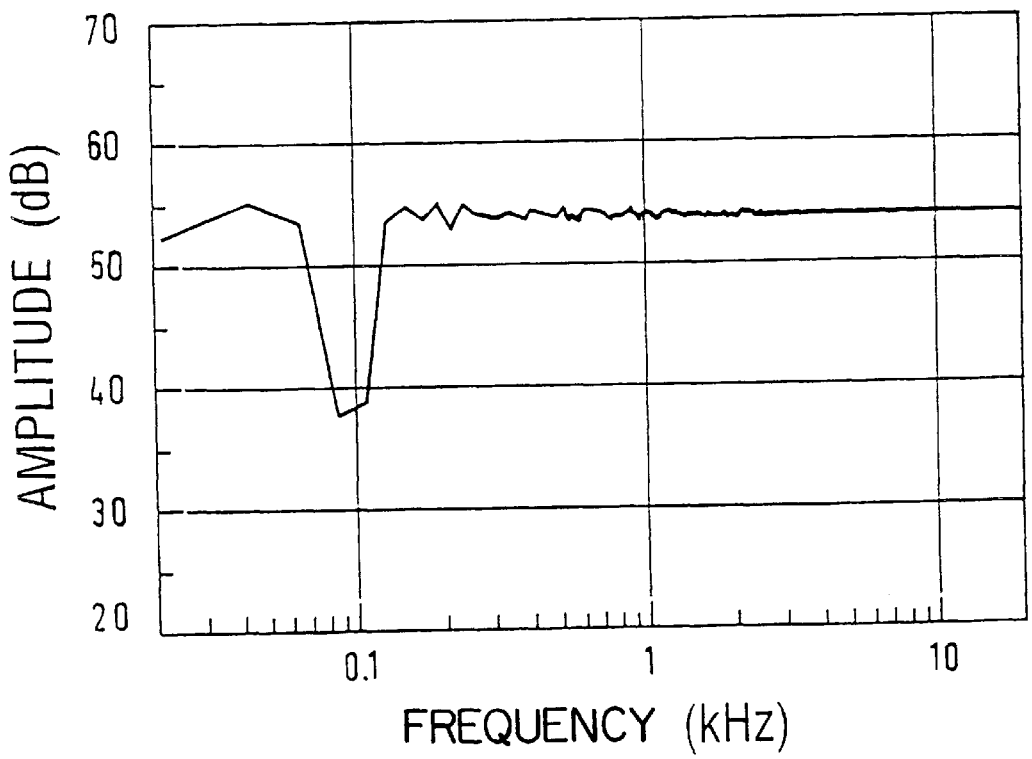
FIG. 6 is a diagram showing the amplitude pattern corresponding to the impulse response of FIG. 5.

In addition, for a further simplification, amplitude values of the impulse response h'(t) according to FIG. 2, which are below a certain threshold, are set at zero. The transformation of the complete approximated impulse response h'(t) in the frequency range results in the amplitude patterns of FIG. 6. At very low frequencies, the amplitude frequency response is no longer flat as in the ideal pattern shown in FIG. 1, but has a slight hump at about 50 Hz, but the band stop function at about 100 Hz is almost as pronounced as in FIG. 1. At higher frequencies above about 110 Hz, the amplitude pattern is relatively flat, aside from slight variations. The variations are so small that they practically do not falsify the auditory impression.

Because of the significantly coarser distribution of the approximated impulse response h'(t), the convolution sum is simplified substantially. In order to be able to better understand this advantage, FIG. 7 shows a portion of the audio signal s(t) to be filtered and, placed thereon, a portion of the approximated impulse response h'(t) according to FIG. 5.

Figure 7:
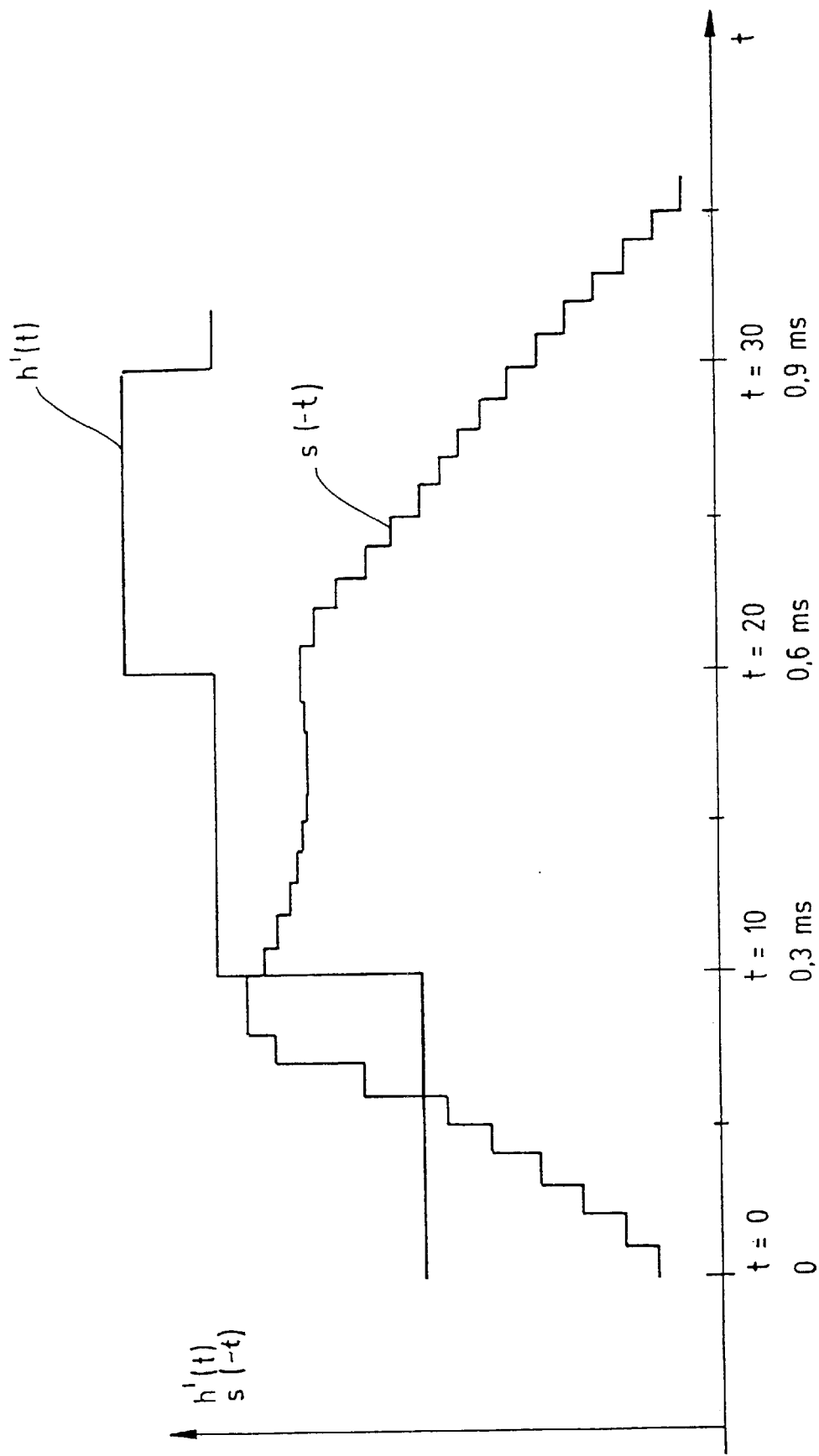
FIG. 7 is a diagram showing a portion of a digitalized audio signal together with a portion from the impulse response of FIG. 5, significantly extended over time and not to scale.

In FIG. 7, the dimensions of the amplitudes are not to scale.

In the selected embodiment, the fact that the impulse response h'(t) is in steps means that ten samples of the audio signal (s) exist in an interval between two step transitions of the approximated impulse response h'(t). Accordingly, for computing the contribution of the audio signal s(t), for example, for the range between t=1 and t=10 folded with h'(t) for t=1 ... 10, it is sufficient if in the range between t=1 and t=10 the sum of the individuals samples is formed and this sum is then multiplied with one of the sampling values of the impulse response of this range between t=1 and t=10. In accordance with the solution of the present invention, the formation of ten individual products which are subsequently summed up is replaced by the summation of ten members and one multiplication, resulting in a significant reduction of computing time.

A further reduction of the required computations results from the fact that it is not necessary to newly form the entire sum for the point t=2. It is sufficient if the sampling value $S_r=-1$ is subtracted from the result computed previously for the range between t=1 and t=10 and to add instead the sampling value $S_r=-11$. The result achieved in this manner is then again multiplied with one of the sampling values of the range t=1 ... 10 of the approximated impulse response h'(t).

The approximated impulse response shown in the partial illustration of FIG. 7 can also be considered an impulse response which has been produced with the same sampling rate as the audio signal, however, the samples of the impulse response are kept constant over several sampling intervals (10 sampling intervals in the illustrated case) independently of the true pattern of the impulse response sampled at the high rate. On the other hand, the approximated impulse response can also be considered an impulse response whose sampling rate appears to be lower by the appropriate factor, i.e., the samples of the impulse response are spaced from each other with respect to time by a period which is greater than the sampling interval of the audio signal.

The steps of the approximated impulse response are advantageously selected in such a way that the amplitude frequency response and, if applicable, also the phase frequency response which is not separately illustrated in the above figures for simplicity's sake, are adapted in an optimum manner to the desired pattern.

Figure 8:
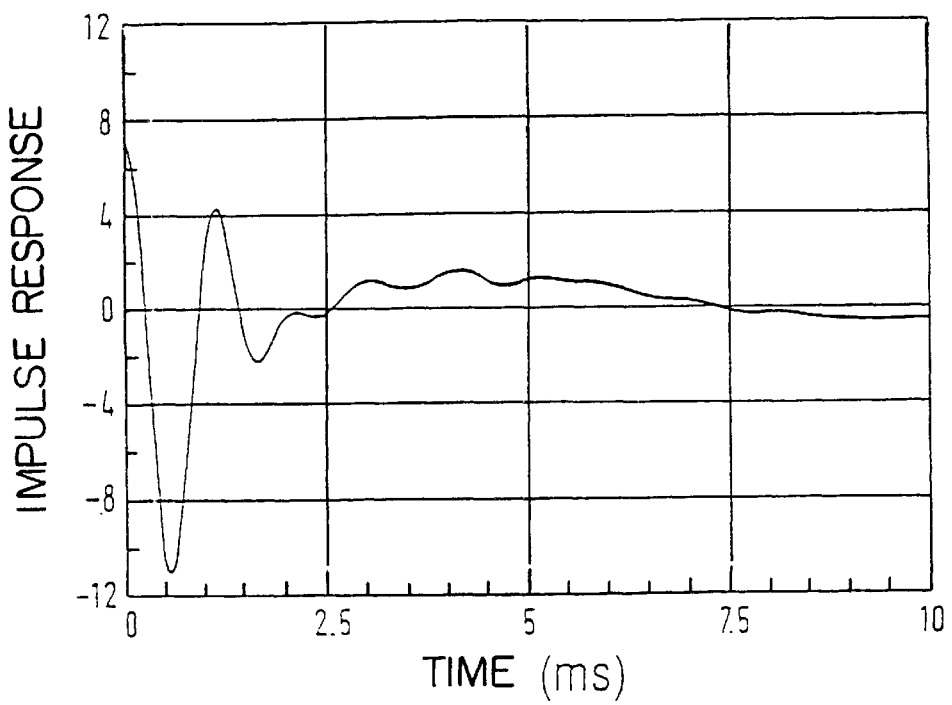
FIG. 8 is a diagram showing another impulse response.

It is also possible to achieve an optimization, not by approximating the impulse response with steps of equal length, but by changing the duration of the steps during the impulse response in such a way that the error between the approximated impulse response and the original or ideal impulse response is as small as possible. Such an embodiment is illustrated, for example, in FIGS. 8 and 9. FIG. 8 shows a theoretical or ideal impulse response which, following a head with relatively high frequencies which ends after about 2.5 ms, has a decay portion with significantly lower frequencies. In this case, the approximation of the stepped impulse response takes place preferably with a small step width in the area of the head of the impulse response, i.e., in the range of between 0 and 2.5ms, while the step width in the "tail" of the impulse response, aside from a hump at about 3 ms, is extremely enlarged.

Figure 9:
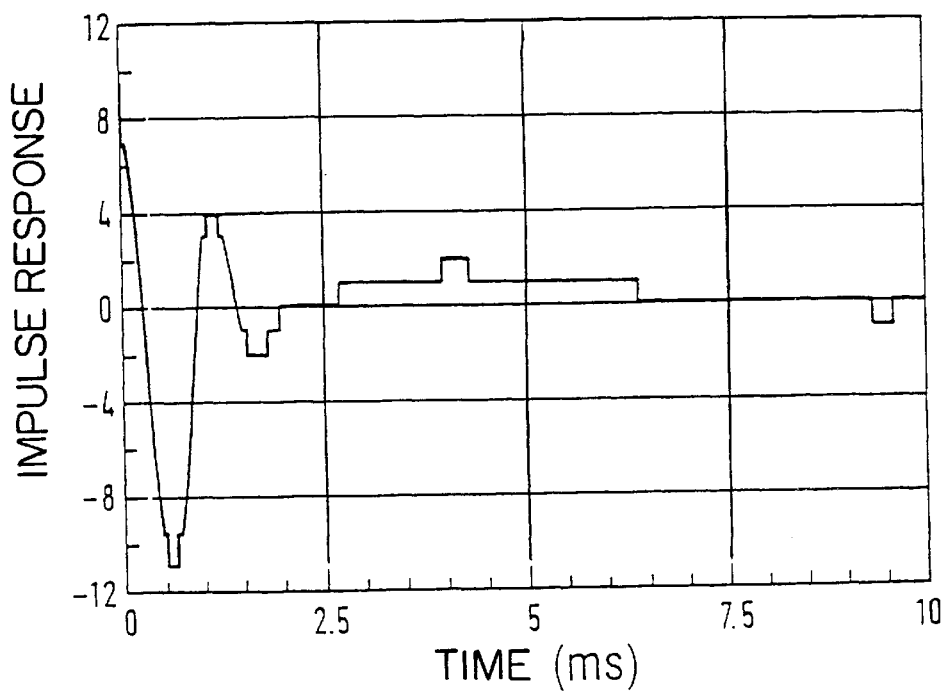
FIG. 9 is a diagram showing an impulse response according to the present invention derived from the impulse response of FIG. 8.

Finally, as also shown in FIG. 9, it is possible to operate in the range of the head of the impulse response with a duration for the steps which coincides with the sampling interval of the audio signal; in FIG. 9, this is indicated by a smooth curve pattern portion (smooth in the sense of essentially step-free) in the range of between 0 and about 0.5 ms, as well as in the range between about 0.75 and 1.0, and finally in another portion of between 1.3 and 1.5 ms.

Figure 10:
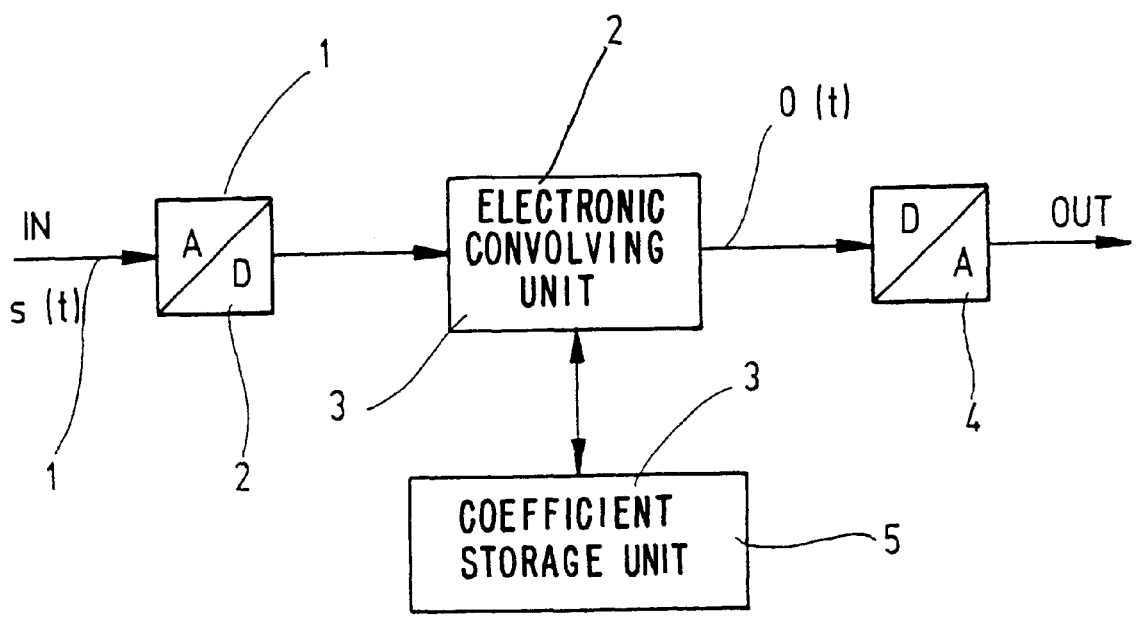
FIG. 10 is an illustration of a circuit arrangement for producing a filtered audio signal.

The filtering method described in detail above can be carried out by the circuit shown in FIG. 10. This circuit has an analog/digital converter 1 into which the audio signal s(t) is fed as an analog signal. The input signal s(t) is converted in the analog/digital converter 1 into a digitalized audio signal, wherein, for meeting the sampling theorem, the sampling frequency is at least twice that of the highest frequency contained in the audio signal s(t). The audio signal s(t) digitalized in this manner reaches an electronic convolving unit 2 which essentially is a computing unit to which a storage unit 3 is connected. Aside from the program, the samples of the impulse response h(t) of the desired filter approximated in accordance with the present invention are stored in the storage unit 3. The summation and multiplication for the approximated computation of the convolution sum are carried out in the computing unit 2. The signal obtained in this manner constitutes the output signal O(t) in digitalized form. If the signal does not have to be subjected to further processing, it can be reconverted in a subsequently arranged digital/analog converter 4 into an analog filtered audio signal.

FIG. 11 shows the architecture of an apparatus which operates in a mixed operation with the use of a FIR filter and the convolution computation according to the present invention. Delay units 5 correspond to the digitalization with the predetermined sampling frequency, wherein, in the case of steps having a shorter duration, the fed-in value of the audio signal s(t) is weighted with the corresponding samples $h_i$ of the impulse response after each delay unit 5. In the range in which processing is carried out over a relatively long period of time with the impulse response having steps of long duration, the signal is advanced through an appropriate number of delay units 5 without further processing and the newly arriving sample is added in a summing unit 6, while the last sampling value disappearing from the interval is subtracted, after a sign reversal in the step 7, from the original sum value contained in a storage unit 8. The result obtained in this manner is multiplied with the sampling values $h_1$ of the impulse response, wherein $h_1$ is the value produced in accordance with the present invention.

Also in this case, a significant simplification is achieved because the FIR filter requires a significantly smaller number of taps.

In the case of digitalized audio signals, filtering occurs by convolving the digitalized audio signal with an also digitalized impulse response. Without special measures, the convolution requires a very large number of computing operations which must be carried out in real time.

The impulse response is approximated in order to reduce this number of computing operations. In the approximated impulse response, in adjacent intervals within the respective interval, the samples are maintained constant over several sampling intervals independently of the true pattern of the underlying impulse response. The magnitude at which the samples are kept constant in each interval corresponds to the magnitude of a random sample of the underlying impulse response falling in the respective interval, for example, the first sample of the original impulse response falling in the respective interval.

While specific embodiments of the invention have been shown and described in detail to illustrate the inventive principles, it will be understood that the invention may be embodied otherwise without departing from such principles.

I claim:

1. A method for filtering an audio signal having a specifiable highest frequency component and its associated period duration and wherein said filtering method employing a filter that has a specifiable impulse response characteristics corresponding to a filter characteristics, comprising the steps of:

providing the audio signal in a digitized form using a sampling interval, wherein the sampling interval has a duration which is half or less than half of a period duration of said specifiable highest frequency component of said audio signal providing a digitized impulse response associated with said filter characteristics, wherein said impulse response is defined by a plurality of impulse response samples corresponding to said impulse response characteristics, wherein said filter is configured such that at least a selected portion of adjacent impulse response samples have an identical value for a predetermined fixed period of time, and forming a convolution sum from said impulse response samples and samples of the audio signal.

2. The method according to claim 1, wherein the time interval corresponding to said adjacent samples has a duration which is greater by a factor of at least 3 times the sampling interval.

3. The method according to claim 1, wherein the time interval corresponding to said adjacent samples has a duration which is greater by a factor of at least 5 times the sampling interval.

4. The method according to claim 1, wherein the time interval corresponding to said adjacent samples has a duration which is greater by a factor of 50 times the sampling interval.

5. The method according to claim 1, wherein, if the impulse response of the filter has zero-axis crossings, the zero-axis crossings of the sampling values of the impulse response utilized for the computation of the convolution sum coincide with the zero-axis crossings of the impulse response of the filter.

6. The method according to claim 1, wherein the time interval corresponding to said adjacent samples have a width which is constant over either a portion of the duration of the impulse response and over the entire impulse response.

7. The method according to claim 1, wherein, in computing the convolution sum, those sampling values of the impulse response are set at zero in which the amplitude of the impulse response of the filter is smaller than a predetermined value.

8. An apparatus for filtering a digitized audio signal having a specifiable highest frequency component and its associated period duration and wherein said apparatus has a specifiable filter characteristics, said apparatus comprising a storage unit for storing values corresponding to the samples of a impulse response associated with said filter characteristics, wherein said filter is configured such that at least a selected portion of adjacent impulse response samples have an identical value corresponding to a specifiable impulse response value for a predetermined fixed period of time;

a convolution unit coupled to said storage unit configured to generate a convolution sum corresponding to said digitized audio signal and said impulse response samples.

9. The apparatus according to claim 8, wherein the time interval corresponding to said adjacent samples has a duration which is greater by a factor of at least 3 times the sampling interval.

10. The apparatus according to claim 8, wherein the time interval corresponding to said adjacent samples has a duration which is greater by a factor of at least 5 times the sampling interval.

11. The apparatus according to claim 8, wherein the time interval corresponding to said adjacent time samples has a duration which is greater by a factor of 50 times the sampling interval.

12. The apparatus according to claim 8, wherein, if the impulse response of the filter has zero-axis crossings, the zero-axis crossings of the sampling values of the impulse response utilized for the computation of the convolution sum coincide with the zero-axis crossings of the impulse response of the filter.

13. The apparatus according to claim 8, wherein the intervals defined in this manner have a width which is constant over a portion of the duration of the impulse response or over the entire impulse response.

14. The apparatus according to claim 8, wherein, among said impulse response samples those samples that have an amplitude smaller than a specifiable threshold value are set to zero.

15. The method according to claim 1, wherein the value of said adjacent impulse response samples is a function of an impulse response value of said specifiable impulse response characteristics within an interval corresponding to said selected portion of adjacent impulse response samples.

16. The apparatus according to claim 8, wherein said convolution unit further comprises:

a plurality of delay elements configured to provide corresponding delayed versions of said digitized audio signals;

an adder configured to add digitized audio samples generated by a group of said delay elements; and a multiplier configured to multiply an added sum generated by said adder with one of said impulse response samples having said specifiable impulse response value.

17. The apparatus according to claim 16, further comprising a subtractor coupled to the last delay element in said group of said delay elements, so as to subtract from said adder the earliest audio sample provided to said group of said delay elements when a following audio sample is provided to said group of delay elements.

* * * * *